(12) United States Patent
Sano et al.

(10) Patent No.: US 11,588,059 B2
(45) Date of Patent: Feb. 21, 2023

(54) STRUCTURAL BODY AND METHOD OF MANUFACTURING THE SAME

(71) Applicant: KABUSHIKI KAISHA TOSHIBA, Tokyo (JP)

(72) Inventors: Mitsuo Sano, Kanagawa (JP); Susumu Obata, Kanagawa (JP); Kazuhito Higuchi, Kanagawa (JP); Kazuo Shimokawa, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/202,022

(22) Filed: Mar. 15, 2021

(65) Prior Publication Data
US 2021/0296513 A1  Sep. 23, 2021

(30) Foreign Application Priority Data

Mar. 23, 2020 (JP) .............................. JP2020-050534

(51) Int. Cl.
| | |
|---|---|
| *H01L 29/94* | (2006.01) |
| *H01L 29/66* | (2006.01) |
| *H01L 29/06* | (2006.01) |
| *H01L 21/306* | (2006.01) |
| *H01L 21/288* | (2006.01) |

(52) U.S. Cl.
CPC ...... *H01L 29/945* (2013.01); *H01L 21/30604* (2013.01); *H01L 29/0665* (2013.01); *H01L 29/66181* (2013.01); *H01L 21/288* (2013.01)

(58) Field of Classification Search
CPC ............ H01L 29/945; H01L 29/66181; H01L 29/0665; H01L 28/91
See application file for complete search history.

(56) References Cited

U.S. PATENT DOCUMENTS

| | | | | |
|---|---|---|---|---|
| 5,635,419 | A | * | 6/1997 | Geiss .................... H01L 29/945 |
| | | | | 257/E21.651 |
| 2007/0264759 | A1 | | 11/2007 | Kamakura |
| 2008/0090074 | A1 | | 4/2008 | Matsumura et al. |
| 2010/0041237 | A1 | | 2/2010 | Lee et al. |
| 2011/0256685 | A1 | | 10/2011 | Suzuki et al. |
| 2011/0266521 | A1 | | 11/2011 | Ferrari et al. |
| 2015/0348964 | A1 | * | 12/2015 | Chou ...................... H01L 28/91 |
| | | | | 257/534 |

(Continued)

FOREIGN PATENT DOCUMENTS

| | | |
|---|---|---|
| JP | 2000-306858 A | 11/2000 |
| JP | 2010-003898 A | 1/2010 |

(Continued)

*Primary Examiner* — Wasiul Haider
(74) *Attorney, Agent, or Firm* — Oblon, McClelland, Maier & Neustadt, L.L.P.

(57) ABSTRACT

A structural body according to an embodiment includes a conductive substrate. A main surface of the conductive substrate includes a first region and a second region adjacent to the first region and lower in height than the first region. The first region is provided with one or more recesses having a bottom, a position of which is lower than a position of the second region. A surface region of the conductive substrate on a side of the main surface includes a porous structure at a position between the second region and the one or more recesses.

6 Claims, 10 Drawing Sheets
(1 of 10 Drawing Sheet(s) Filed in Color)

(56) References Cited

U.S. PATENT DOCUMENTS

| | | |
|---|---|---|
| 2019/0252199 A1 | 8/2019 | Matsuo et al. |
| 2020/0219656 A1 | 7/2020 | Higuchi et al. |

FOREIGN PATENT DOCUMENTS

| | | |
|---|---|---|
| JP | 2010-506385 A | 2/2010 |
| JP | 4524680 B2 | 6/2010 |
| JP | 2011-101009 A | 5/2011 |
| JP | 2011-228340 A | 11/2011 |
| JP | 2013-527103 A | 6/2013 |
| JP | 2019-140225 A | 8/2019 |
| WO | 2019-171470 A1 | 9/2019 |

* cited by examiner

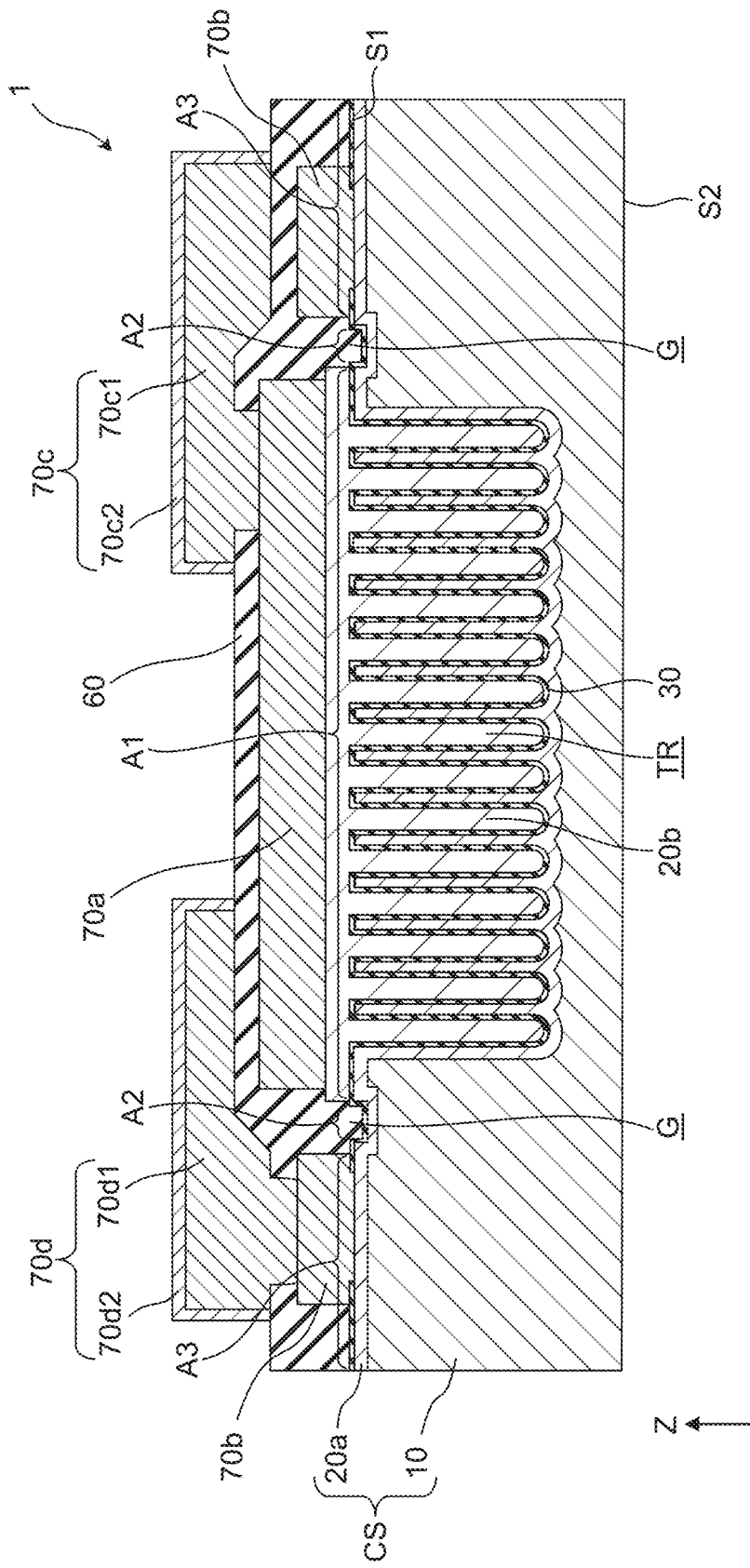
F I G. 2

STRUCTURAL BODY AND METHOD OF MANUFACTURING THE SAME

CROSS-REFERENCE TO RELATED APPLICATIONS

This application is based upon and claims the benefit of priority from Japanese Patent Application No. 2020-050534, filed Mar. 23, 2020, the entire contents of which are incorporated herein by reference.

FIELD

Embodiments described herein relate generally to a structural body.

BACKGROUND

Metal-assisted chemical etching (MacEtch) is a method of etching a semiconductor surface using a noble metal as a catalyst. According to MacEtch, for example, a recess with a high aspect ratio can be formed on a semiconductor substrate.

BRIEF DESCRIPTION OF THE DRAWINGS

The patent or application file contains at least one drawing executed in color. Copies of this patent or patent application publication with color drawing(s) will be provided by the office upon request and payment of the necessary fee.

FIG. 2 is a cross-sectional view taken along a line II-II of the capacitor shown in FIG. 1;

DETAILED DESCRIPTION

Figure 1:
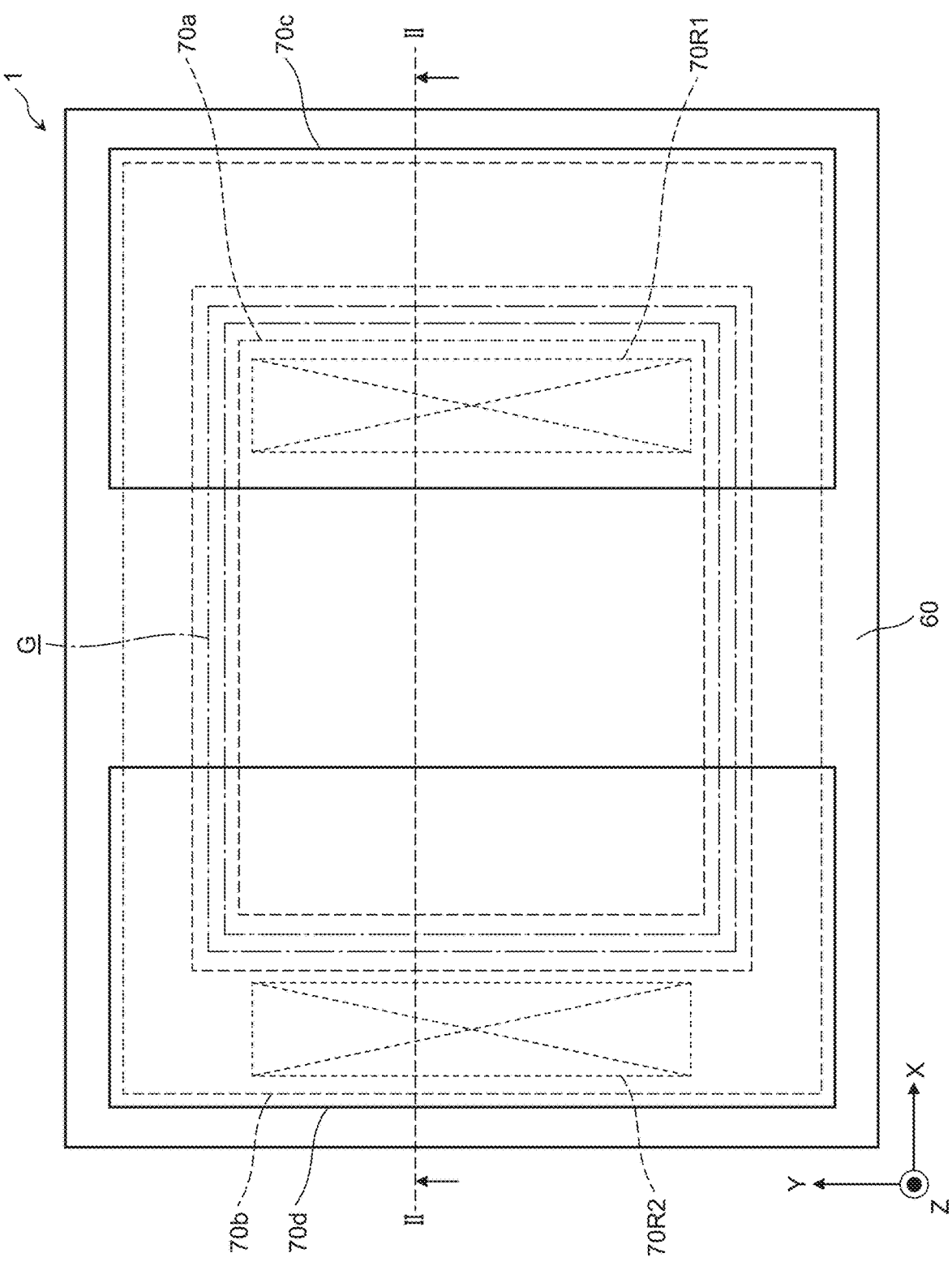
FIG. 1 is a top view of a capacitor according to an Embodiment.

A structural body according to an aspect comprises a conductive substrate containing a semiconductor material, the conductive substrate having a main surface including a first region and a second region, the second region being adjacent to the first region and lower in height than the first region, the first region being provided with one or more recesses having a bottom, a position of the bottom being lower than a position of the second region, and the conductive substrate having a surface region on a side of the main surface, the surface region including a porous structure at a position between the second region and the one or more recesses.

A method of manufacturing a structural body according to another aspect, comprises: preparing a substrate containing a semiconductor material and having a main surface, the main surface including a first region and a second region, the second region being adjacent to the first region and lower in height than the first region; forming a catalyst layer containing a noble metal so as to cover at least a part of the first region without covering the second region; and etching the substrate with an etching agent containing an oxidizer and hydrogen fluoride in a presence of the catalyst layer.

An embodiment will be described in detail below with reference to the accompanying drawings. Note that the same reference numerals denote constituent elements which achieve the same or similar functions throughout all the drawings, and repetitive explanations will be omitted. As an example of a structural body, a capacitor is explained below.

Figure 3:
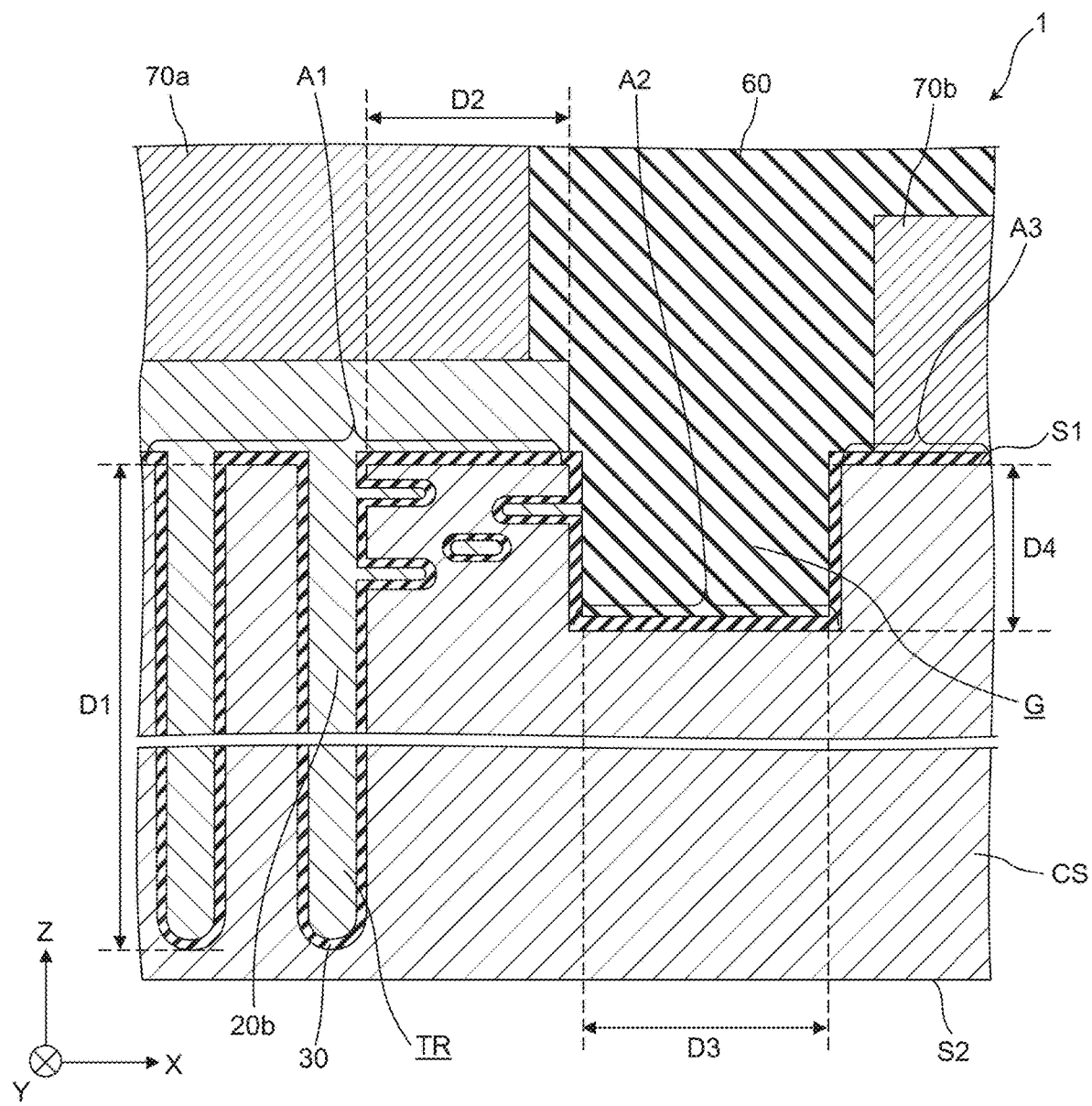
FIG. 3 is an enlarged cross-sectional view showing a part of the structure shown in FIG. 2.

FIGS. 1 to 3 show a capacitor according to an embodiment.

A capacitor 1 shown in FIGS. 1 to 3 includes a conductive substrate CS, a conductive layer 20b, and a dielectric layer 30, as shown in FIGS. 2 and 3.

In each figure, an X direction is a direction parallel to a main surface of the conductive substrate CS, and a Y direction is a direction parallel to the main surface of the conductive substrate CS and perpendicular to the X direction. In addition, a Z direction is a thickness direction of the conductive substrate CS, i.e., a direction perpendicular to the X direction and the Y direction.

The conductive substrate CS includes a semiconductor material such as silicon. The conductive substrate CS is a substrate having electrical conductivity at least in its surface facing the conductive layer 20b. The conductive substrate CS serves as a lower electrode of the capacitor.

The conductive substrate CS has a first main surface S1, a second main surface S2, and an end face extending from an edge of the first main surface S1 to an edge of the second main surface S2. Here, the conductive substrate CS has a flat and approximately right-angled parallelepiped shape. The conductive substrate CS may have other shapes.

The first main surface S1, i.e., a top surface of the conductive substrate CS in this embodiment, includes a first region A1, a second region A2, and a third region A3. The second region A2 is adjacent to the first region A1, and lower than the first region in height. The third region A3 is adjacent to the first region A1 with the second region A2 interposed therebetween. The height of the third region A3 may be lower or higher than, or equal to the height of the first region A1 or the second region A2. In the following, as an example, the height of the third region A3 is assumed to be equal to that of the first region A1.

The first main surface S1 is provided with a groove G shown in FIGS. 1 to 3. Here, the groove G is provided to surround the first region A1. Thus, of the first main surface S1, the region surrounded by the groove G corresponds to the first region A1, the bottom of the groove G corresponds to the second region A2, and the region adjacent to the first region A1 with the groove G interposed therebetween corresponds to the third region A3.

The first region A1 is provided with a plurality of recesses TR each having a shape extending in one direction and arranged in the width direction thereof. The recesses TR are spaced apart from one another. Herein, the recesses TR are trenches extending in the Y direction and arranged in the X direction.

Portions of the conductive substrate CS each sandwiched between one and the other of adjacent recesses TR are projections. The projections each have a shape extending in the Y direction and are arranged in the X direction. That is, the first region A1 is provided with a plurality of wall parts each having a shape extending in the Y direction and the Z direction and arranged in the X direction as the projections.

The "length direction" of the recesses or the projections is a length direction of orthogonal projections of the recesses or the projections onto a plane perpendicular to the thickness direction of the conductive substrate.

A length of an opening of each recess TR is within a range of 10 µm to 500 µm according to an example, and within a range of 50 µm to 100 µm according to another example.

A width of the opening of the recess TR, i.e., a distance between the projections adjacent in the width direction, is preferably 0.3 µm or more. If this width or distance is reduced, a larger electric capacitance can be achieved. However, if this width or distance is reduced, it becomes difficult to form a stacked structure including the dielectric layer 30 and the conductive layer 20b in the recesses TR.

A depth D1 of the recesses TR or a height of the projections is within a range of 10 µm to 300 µm according to an example, and within a range of 50 µm to 100 µm according to another example.

A distance between the recesses TR adjacent in the width direction, i.e., a thickness of the projection, is preferably 0.1 µm or more. If this distance or thickness is reduced, a larger electric capacitance can be achieved. However, if this distance or thickness is reduced, the projections are likely to be damaged.

Here, cross sections of the recesses TR perpendicular to the length directions are rectangular. However, these cross sections need not be rectangular and may have, for example, a tapered shape.

As shown in FIG. 2, the conductive substrate CS includes a substrate 10 and a conductive layer 20a. Note that in FIG. 3, the conductive substrate CS is depicted without distinguishing the substrate 10 and the conductive layer 20a.

The substrate 10 has the same shape as that of the conductive substrate CS. The substrate 10 is a substrate containing a semiconductor material, for example, a semiconductor substrate. The substrate 10 is preferably a substrate containing silicon such as a silicon substrate. Such a substrate can be processed using semiconductor processes.

The conductive layer 20a is provided on the substrate 10. The conductive layer 20a is made of, for example, polysilicon doped with impurities to improve the electrical conductivity, or a metal such as molybdenum, aluminum, gold, tungsten, platinum, nickel, or copper, or an alloy thereof. The conductive layer 20a may have a single-layer structure or a multi-layer structure.

A thickness of the conductive layer 20a is preferably within a range of 0.05 µm to 1 µm, and more preferably within a range of 0.1 µm to 0.3 µm. If the conductive layer 20a is thin, the possibility exists that a discontinuous portion may be generated in the conductive layer 20a, or a sheet resistance of the conductive layer 20a may be excessively increased. When the conductive layer 20a is thickened, manufacturing costs increase.

Here, as an example, the substrate 10 is a semiconductor substrate such as a silicon substrate, and the conductive layer 20a is a high-concentration doped layer that is a surface region of the semiconductor substrate doped with impurities at a high concentration. In this case, the projections, if thin enough, can be entirely doped with impurities at a high concentration.

If the substrate 10 has a high electrical conductivity, the conductive layer 20a may be omitted, and the substrate 10 may be used as the conductive substrate CS. For example, if the substrate 10 is a semiconductor substrate made of a semiconductor doped with P-type or N-type impurities, or a metal substrate, the conductive layer 20a can be omitted. In this case, at least a surface region of the substrate 10, e.g., the entire substrate 10, serves as the conductive layer 20a.

As shown in FIG. 3, a surface region on the first main surface S1 side of the conductive substrate CS includes a porous structure at a position between the second region A2 and the recesses TR. The porous structure is a structure that a plurality of holes form in the surface region of the substrate 10. Many of the holes extend, for example, in a direction approximately perpendicular to the thickness direction of the substrate 10 from sidewalls of the recesses TR. These holes may reach or may not reach a sidewall of the groove G. The porous structure has a dimension in the thickness direction of the conductive substrate CS within a range of 100 nm to 100,000 nm according to an example, and within a range of 50 nm to 50,000 nm according to another example.

The conductive layer 20a may be conformal to the porous structure or may entirely fill the holes. In other words, as long as a surface region on the first main surface S1 side of the substrate 10 is porous at a position between the second region A2 and the recesses TR, the conductive substrate CS may be or may not be porous at this position.

The conductive layer 20b serves as an upper electrode of the capacitor. The conductive layer 20b is provided on the first region A1, and covers sidewalls and bottom surfaces of the recesses TR.

The conductive layer 20b is made of, for example, polysilicon doped with impurities to improve the electrical conductivity, or a metal such as molybdenum, aluminum, gold, tungsten, platinum, nickel, or copper, or an alloy thereof. The conductive layer 20b may have a single-layer structure or a multi-layer structure.

A thickness of the conductive layer 20b is preferably within a range of 0.05 µm to 1 µm, and more preferably within a range of 0.1 µm to 0.3 µm. If the conductive layer 20b is thin, the possibility exists that a discontinuous portion may be generated in the conductive layer 20b, or a sheet resistance of the conductive layer 20b may be excessively increased. If the conductive layer 20b is thick, it may be difficult to form the conductive layer 20a and the dielectric layer 30 with sufficient thicknesses.

In FIGS. 2 and 3, the conductive layer 20b is provided so that the recesses TR are completely filled with the conductive layer 20b and the dielectric layer 30. The conductive layer 20b may be a layer that is conformal to a surface of the conductive substrate CS. That is, the conductive layer 20b may be a layer having an approximately uniform thickness. In this case, the recesses TR are not completely filled with the conductive layer 20b and the dielectric layer 30.

The dielectric layer 30 is interposed between the conductive substrate CS and the conductive layer 20b. The dielectric layer 30 is a layer that is conformal to the surface of the conductive substrate CS. The dielectric layer 30 electrically insulates the conductive substrate CS and the conductive layer 20b from each other.

The dielectric layer 30 is made of, for example, an organic dielectric or an inorganic dielectric. As the organic dielectric, for example, polyimide can be used. As the inorganic dielectric, a ferroelectric can be used. Paraelectrics such as silicon nitride, silicon oxide, silicon oxynitride, titanium oxide, and tantalum oxide, are preferable. These paraelectrics have a small change in dielectric constant with temperature. Therefore, when the paraelectrics are used for the dielectric layer 30, the heat resistance of the capacitor 1 can be improved.

A thickness of the dielectric layer 30 is preferably within a range of 0.005 µm to 0.5 µm, and more preferably within a range of 0.01 µm to 0.1 µm. When the dielectric layer 30 is thin, the possibility exists that a discontinuous portion may be generated in the dielectric layer 30, and the conductive substrate CS and the conductive layer 20b may be short-circuited. Further, if the dielectric layer 30 is thinned, a withstand voltage is lowered even if there is no short circuit, and a possibility of short-circuiting when a voltage is applied is increased. When the dielectric layer 30 is thickened, the withstand voltage increases, but the electric capacitance decreases.

The dielectric layer 30 is opened at a position of the third region A3 such that the opening surrounds the first region A1 and the second region A2. That is, the dielectric layer 30 allows the conductive layer 20a to be exposed at this position. Here, the portion of the dielectric layer 30 that is provided on the first main surface S1 is opened in a frame shape.

This capacitor 1 further includes an insulating layer 60, a first internal electrode 70a, a second internal electrode 70b, a first external electrode 70c, and a second external electrode 70d.

The first internal electrode 70a is provided on the first region A1. The first internal electrode 70a is electrically connected to the conductive layer 20b. Here, the first internal electrode 70a is a rectangular electrode located at a center of the first main surface S1.

The second internal electrode 70b is provided on the third region A3. The second internal electrode 70b is in contact with the conductive substrate CS at a position of the opening provided in the dielectric layer 30. Thereby, the second internal electrode 70b is electrically connected to the conductive substrate CS. Here, the second internal electrode 70b is a frame-shaped electrode arranged to surround the first internal electrode 70a.

The first internal electrode 70a and the second internal electrode 70b may have a single-layer structure or a multi-layer structure. Each layer constituting the first internal electrode 70a and the second internal electrode 70b is made of, for example, a metal such as molybdenum, aluminum, gold, tungsten, platinum, copper, nickel, or an alloy containing one or more of them.

The insulating layer 60 covers portions of the conductive layer 20b and the dielectric layer 30 that are located on the first main surface S1, and further covers the first internal electrode 70a and the second internal electrode 70b. The insulating layer 60 partially opens at a position of a part of the first internal electrode 70a and a position of a part of the second internal electrode 70b.

The insulating layer 60 may have a single-layer structure or a multi-layer structure. Each layer constituting the insulating layer 60 is made of, for example, an inorganic insulator such as silicon nitride and silicon oxide, or an organic insulator such as polyimide and novolac resin.

The first external electrode 70c is provided on the insulating layer 60. The first external electrode 70c is in contact with the first internal electrode 70a at a position of one or more openings provided in the insulating layer 60. Thereby, the first external electrode 70c is electrically connected to the first internal electrode 70a. In FIG. 1, a region 70R1 is a region where the first external electrode 70c and the first internal electrode 70a are in contact with each other.

The second external electrode 70d is provided on the insulating layer 60. The second external electrode 70d is in contact with the second internal electrode 70b at a position of the remaining opening(s) provided in the insulating layer 60. Thereby, the second external electrode 70d is electrically connected to the second internal electrode 70b. In FIG. 1, a region 70R2 is a region where the second external electrode 70d and the second internal electrode 70b are in contact with each other.

The first external electrode 70c has a stacked structure including a first metal layer 70c1 and a second metal layer 70c2. The second external electrode 70d has a stacked structure including a first metal layer 70d1 and a second metal layer 70d2.

The first metal layers 70c1 and 70d1 are made of, for example, copper. The second metal layers 70c2 and 70d2 cover upper and end surfaces of the first metal layers 70c1 and 70d1, respectively. The second metal layers 70c2 and 70d2 are constituted by, for example, a stacked film of a nickel or nickel alloy layer and a gold layer. The second metal layers 70c2 and 70d2 can be omitted.

The first external electrode 70c or the first internal electrode 70a may further include a barrier layer at a position adjacent to an interface therebetween. The second external electrode 70d or the second internal electrode 70b may further include a barrier layer at a position adjacent to an interface therebetween, too. As a material of the barrier layer, for example, titanium can be used.

This capacitor 1 is, for example, manufactured by the following method. Hereinafter, an example of a method of manufacturing the capacitor 1 will be described with reference to FIG. 4 to FIG. 6.

Figure 4:
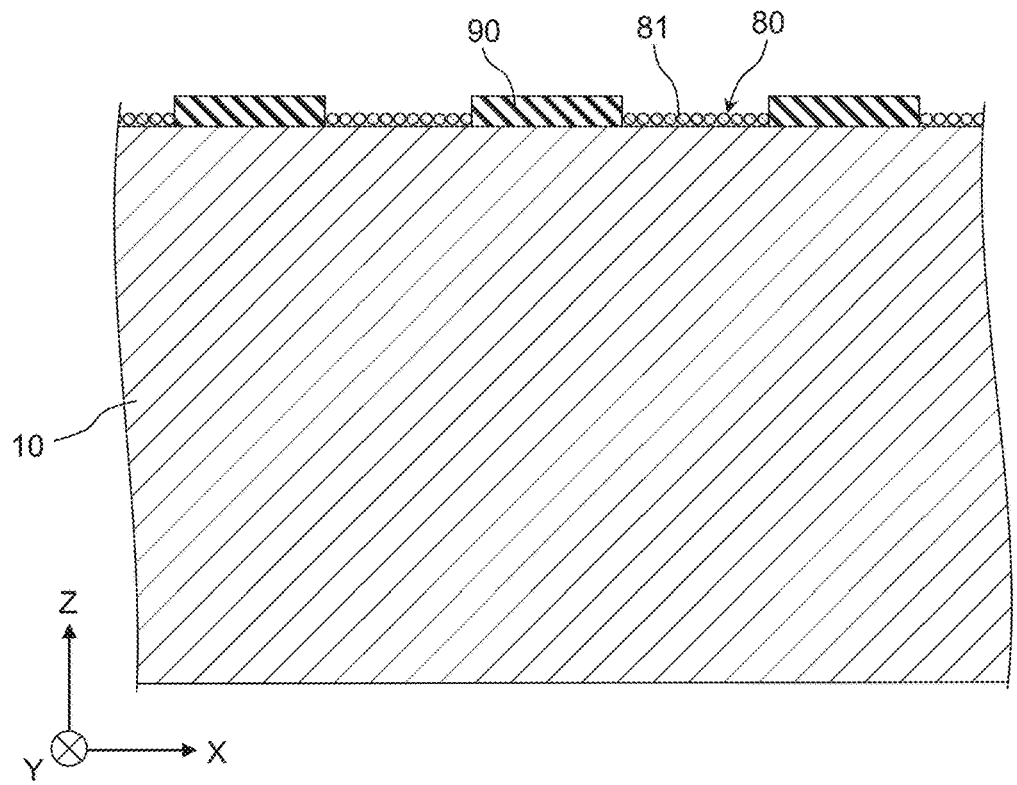
FIG. 4 is a cross-sectional view showing a process in the manufacture of the capacitor shown in FIGS. 1 to 3.

In this method, the substrate 10 shown in FIG. 4 is first prepared. Here, as an example, it is supposed that the substrate 10 is a single-crystal silicon wafer. A plane orientation of the single-crystal silicon wafer is not particularly limited, but in this embodiment, silicon wafer whose main surface is a (100) plane is used. As the substrate 10, a silicon wafer whose main surface is a (110) plane can also be used.

Next, recesses are formed on the substrate 10 by MacEtch (Metal-Assisted Chemical Etching).

That is, as shown in FIG. 4, a catalyst layer 80 containing a noble metal is first formed on the substrate 10. The catalyst layer 80 is formed so as to partially cover one main surface (hereinafter, referred to as the "first surface") of the substrate 10.

Specifically, a mask layer 90 is first formed on the first surface of the substrate 10. The mask layer 90 is opened at positions corresponding to the recesses TR. The mask layer 90 prevents a noble metal, to be described later, from coming into contact with portions of the first surface that are covered with the mask layer 90.

Examples of the material of the mask layer 90 include organic materials such as polyimide, fluororesin, phenol resin, acrylic resin, and novolac resin, and inorganic materials such as silicon oxide and silicon nitride.

The mask layer 90 can be formed by, for example, existing semiconductor processes. The mask layer 90 made of an organic material can be formed by, for example, photolithography. The mask layer 90 made of an inorganic material can be formed by, for example, deposition of an inorganic material layer by vapor deposition, formation of a mask by photolithography, and patterning of the inorganic material layer by etching. Alternatively, the mask layer 90 made of an inorganic material can be formed by oxidation or nitriding of the surface region of the substrate 10, formation of a mask by photolithography, and patterning of an oxide or nitride layer by etching. The mask layer 90 can be omitted.

Next, the catalyst layer 80 is formed on regions of the first surface that are not covered with the mask layer 90. The catalyst layer 80 is, for example, a discontinuous layer containing a noble metal. Here, as an example, it is supposed that the catalyst layer 80 is a particulate layer formed of catalyst particles 81 containing a noble metal.

The noble metal is, for example, one or more of gold, silver, platinum, rhodium, palladium, and ruthenium. The catalyst layer 80 and the catalyst particles 81 may further contain a metal other than a noble metal such as titanium.

The catalyst layer 80 can be formed by, for example, electroplating, reduction plating, or displacement plating. The catalyst layer 80 can also be formed by application of a dispersion containing noble metal particles, or vapor deposition such as evaporation or sputtering. Of these methods, the displacement plating is particularly favorable because it is possible to directly and evenly deposit the noble metal on the regions of the first surface that are not covered with the mask layer 90.

Next, the substrate 10 is etched with an assist from a noble metal as a catalyst to form the recesses on the first surface.

Figure 5:
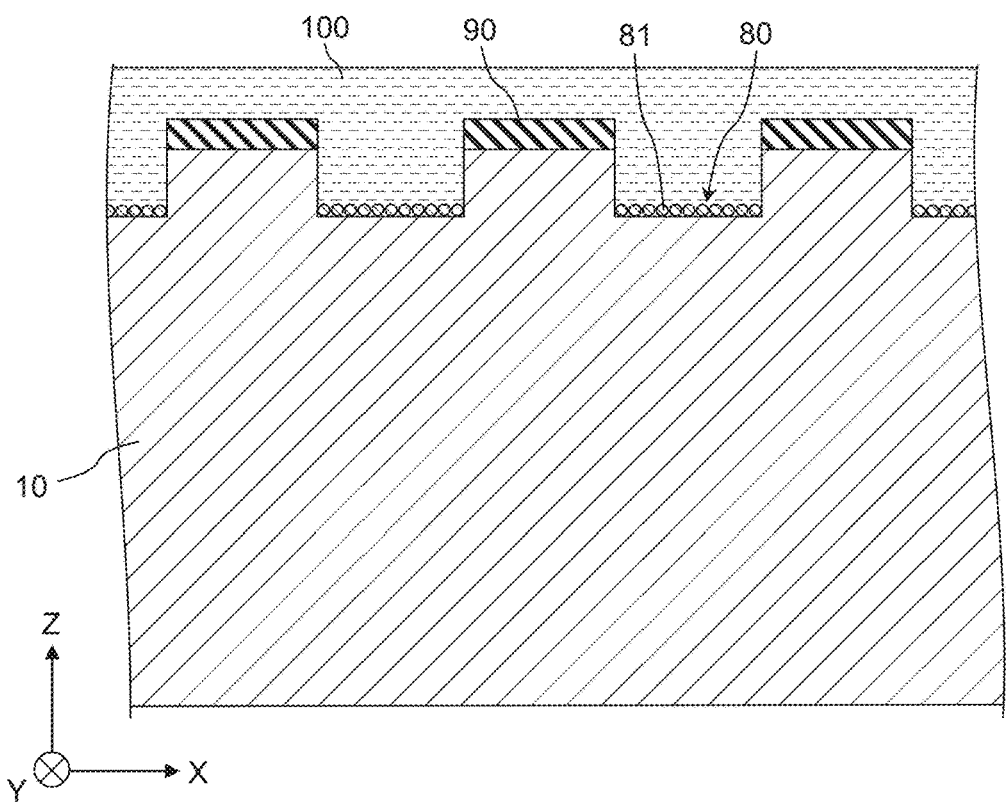
FIG. 5 is a cross-sectional view showing another process in the manufacture of the capacitor shown in FIGS. 1 to 3.

Specifically, as shown in FIG. 5, the substrate 10 is etched with an etching agent 100. For example, the substrate 10 is immersed in the etching agent 100 in liquid form to bring the etching agent 100 into contact with the substrate 10.

The etching agent 100 contains an oxidizer and hydrogen fluoride.

The concentration of hydrogen fluoride in the etching agent 100 is preferably within a range of 1 mol/L to 20 mol/L, more preferably within a range of 5 mol/L to 10 mol/L, and further preferably within a range of 3 mol/L to 7 mol/L. When the hydrogen fluoride concentration is low, it is difficult to achieve a high etching rate. When the hydrogen fluoride concentration is high, excess side etching may occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is favorable as the oxidizer because no harmful byproducts are produced, and a semiconductor element is not contaminated. The concentration of the oxidizer in the etching agent 100 is preferably within a range of 0.2 mol/L to 8 mol/L, more preferably within a range of 2 mol/L to 4 mol/L, and further preferably within a range of 3 mol/L to 4 mol/L.

The etching agent 100 may further contain a buffer. The buffer contains, for example, at least one of ammonium fluoride and ammonia. As an example, the buffer is ammonium fluoride. As another example, the buffer is a mixture of ammonium fluoride and ammonia.

The etching agent 100 may further contain other components such as water.

When such an etching agent 100 is used, the material of the substrate 10, i.e. silicon in this embodiment, is oxidized only in regions of the substrate 10 that are close to the catalyst particles 81. Oxide generated thereby is dissolved and removed by hydrofluoric acid. Therefore, only the portions close to the catalyst particles 81 are selectively etched.

The catalyst particles 81 move toward the other main surface (hereinafter, referred to as the "second surface") of the substrate 10 with the progress of etching, where etching similar to the above is performed. As a result, as shown in FIG. 5, at the position of the catalyst layer 80, etching proceeds from the first surface toward the second surface in a direction perpendicular to the first surface.

Figure 6:
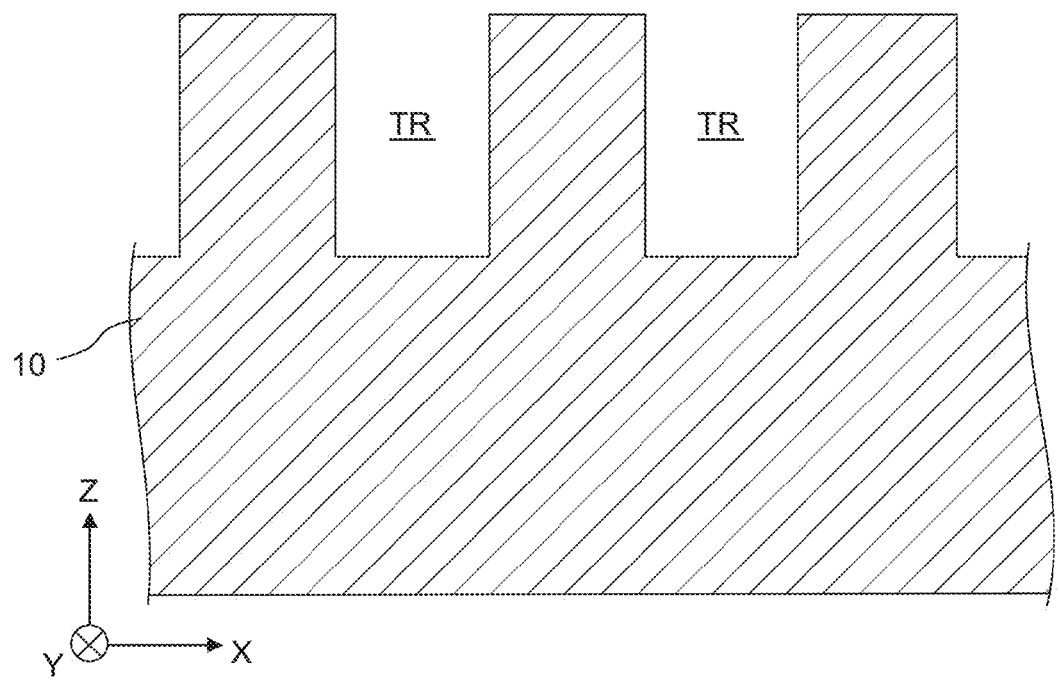
FIG. 6 is a cross-sectional view showing a structure obtained by the processes of FIGS. 4 and 5.

In this way, the recesses TR shown in FIG. 6 are formed on the first surface.

Thereafter, the mask layer 90 and the catalyst layer 80 are removed from the substrate 10.

Next, the conductive layer 20a shown in FIG. 2 is formed on the substrate 10 to obtain the conductive substrate CS. The conductive layer 20a can be formed by, for example, doping the surface region of the substrate 10 with impurities at a high concentration. The conductive layer 20a made of polysilicon can be formed by, for example, LPCVD (low pressure chemical vapor deposition). The conductive layer 20a made of metal can be formed by, for example, electrolytic plating, reduction plating, or displacement plating.

A plating solution is a liquid containing a salt of a metal to be plated. As the plating solution, a general plating solution, such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

The conductive layer 20a is preferably formed by a plating method using a plating solution containing a salt of a metal to be plated, a surfactant, and carbon dioxide in a supercritical or subcritical state. In this plating method, the surfactant is interposed between particles made of supercritical carbon dioxide and a continuous phase of a solution containing a salt of a metal to be plated. That is, the surfactant is allowed to form micelles in the plating solution, and supercritical carbon dioxide is incorporated in these micelles.

In a normal plating method, the supply of the metal to be plated may be insufficient in the vicinity of the bottom portions of the recesses. This is particularly noticeable when a ratio D/W of the depth D to a width or diameter W of the recesses is large.

The micelles incorporating supercritical carbon dioxide can easily enter narrow gaps. As the micelles move, the solution containing the salt of the metal to be plated also moves. Therefore, according to a plating method using a plating solution containing a salt of a metal to be plated, a surfactant, and carbon dioxide in a supercritical or subcritical state, the conductive layer 20a having a uniform thickness can be easily formed.

Next, the dielectric layer 30 is formed on the conductive layer 20a. The dielectric layer 30 can be formed by, for example, CVD (chemical vapor deposition). Alternatively, the dielectric layer 30 can be formed by oxidizing, nitriding, or oxynitriding the surface of the conductive layer 20a.

Next, the conductive layer 20b is formed on the dielectric layer 30. As the conductive layer 20b, for example, a conductive layer made of polysilicon or metal is formed. Such a conductive layer 20b can be formed by, for example, the same method as described above for the conductive layer 20a.

Next, an opening is formed in the dielectric layer 30. The opening is formed at the position of the third region A3. Here, a portion of the dielectric layer 30 that is located on the first main surface S1 is opened in a frame shape. This opening can be formed by, for example, formation of a mask by photolithography and patterning by etching.

Next, a metal layer is formed and patterned to obtain the first internal electrode 70a and the second internal electrode 70b. The first internal electrode 70a and the second internal electrode 70b can be formed by, for example, a combination of film formation by sputtering or plating, and photolithography.

Thereafter, the insulating layer 60 is formed. The insulating layer 60 is opened at the positions corresponding to a part of the first internal electrode 70a and a part of the second internal electrode 70b. The insulating layer 60 can be formed by, for example, combination of film formation by CVD and photolithography.

Next, the first external electrode 70c and the second external electrode 70d are formed on the insulating layer 60. Specifically, first, the first metal layers 70c1 and 70d1 are formed. Next, the second metal layers 70c2 and 70d2 are formed. The first metal layers 70c1 and 70d1 and the second metal layers 70c2 and 70d2 can be formed by, for example, a combination of film formation by sputtering or plating, and photolithography.

Thereafter, the structure thus obtained is diced. In the manner described above, the capacitor 1 shown in FIGS. 1 to 3 is obtained.

In this capacitor 1, the recesses TR are provided on the first main surface S1, and the stacked structure including the dielectric layer 30 and the conductive layer 20b is provided not only on the first main surface S1 but also in the recesses TR. Therefore, this capacitor 1 can achieve a large electric capacitance.

When the aforementioned structure is adopted for the capacitor 1, progress of etching in an in-plane direction can be suppressed in MacEtch. Therefore, the structure is less prone to cause a short circuit between the conductive layer 20b and the second internal electrode 70b. This effect will be described below.

Figure 7:
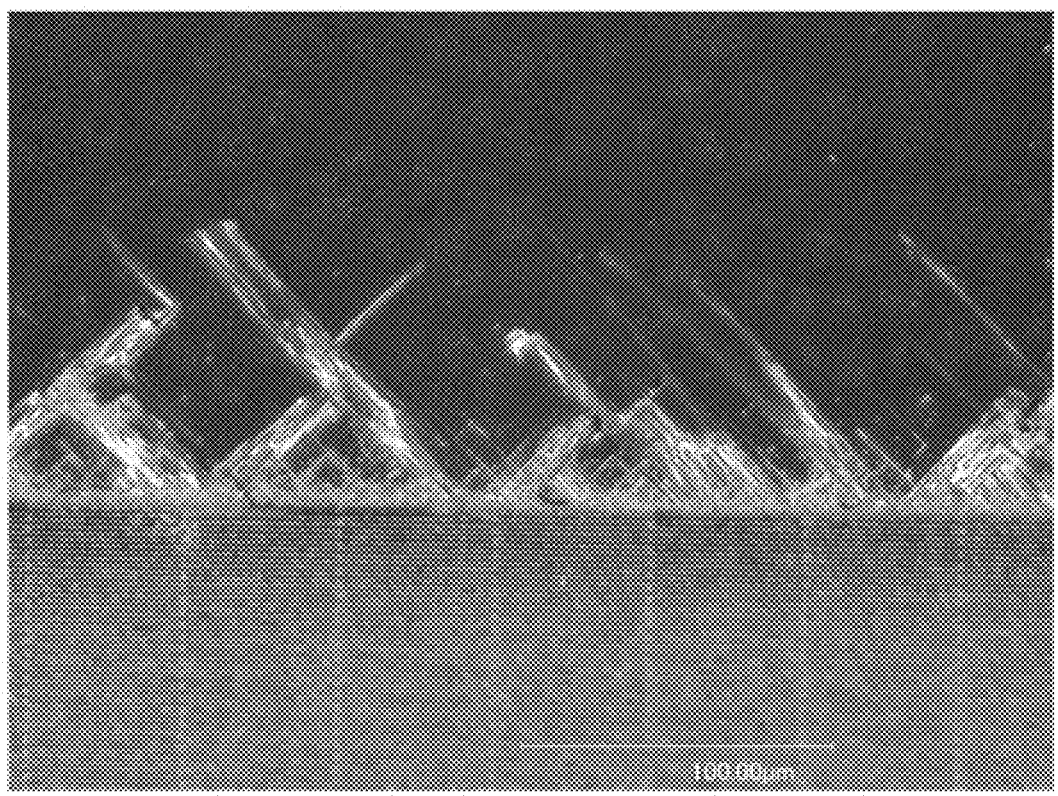
FIG. 7 is an electron micrograph showing an example of a structure obtained when a groove is omitted.

FIG. 7 is an electron micrograph showing an example of a structure obtained when a groove is omitted.

The structure shown in FIG. 7 is obtained in a case in which a silicon substrate is used as the substrate 10 and the recesses TR are formed without forming a groove G. The photograph of FIG. 7 is obtained by capturing the surface on the first main surface side of the substrate 10.

In the photograph of FIG. 7, the lower about one third (⅓) area corresponds to the first region A1. In the first region A1, the recesses TR, each extending laterally, are arranged in a matrix.

In the other area, holes extend from the first region A1. In many of the holes, the length direction is substantially perpendicular to the thickness direction of the substrate 10, and inclined with respect to an outline of the first region A1. The holes exist only in a region near the first main surface S1.

If no groove G is provided, the holes may extend from the sidewalls of the recesses TR to a position below the second internal electrode 70b. In this case, therefore, a short circuit may occur between the conductive layer 20b and the second internal electrode 70b. Otherwise, even if there is no short circuit, a withstand voltage may be lowered, and a possibility of short-circuiting, when a voltage is applied, will be high.

If a groove G is provided, as shown in FIG. 3, a porous structure is formed in a surface region of the conductive substrate CS on the first main surface S1 side at positions between the second region A2 and the recesses TR. However, since the groove G is provided, the holes that form the porous structure are not formed at a position of the third region A3. Thus, the progress of etching in the in-plane direction can be suppressed by providing the groove G. Therefore, the structure explained above with reference to FIGS. 1 to 3 is less prone to cause a short circuit between the conductive layer 20b and the second internal electrode 70b.

The reason why the groove G suppresses the progress of etching in the in-plane direction is considered to be as follows.

Figure 8:
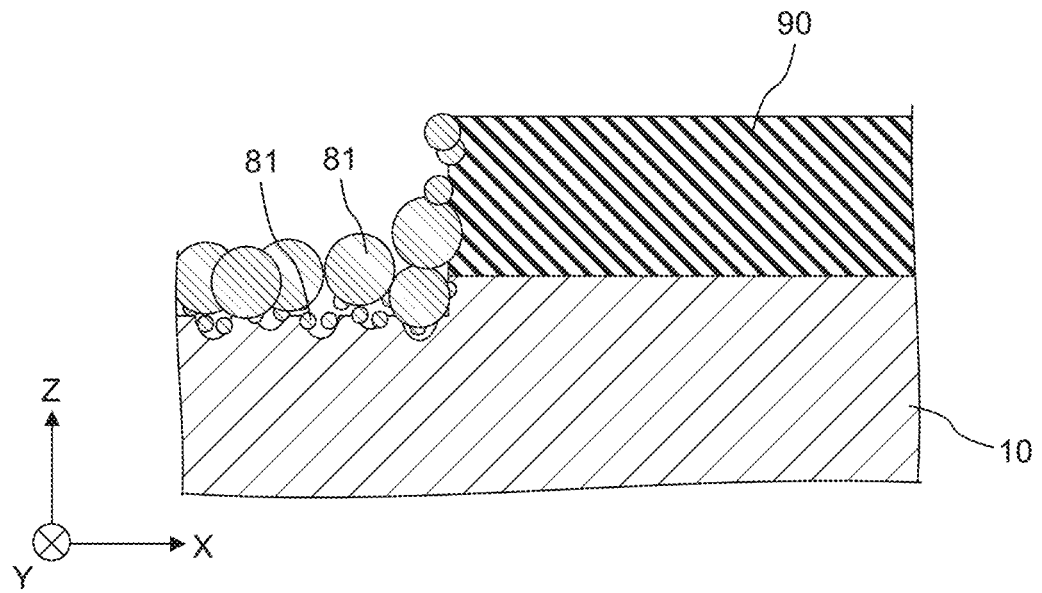
FIG. 8 is a cross-sectional view showing an example of a catalyst layer-forming process when a groove is omitted.
Figure 9:
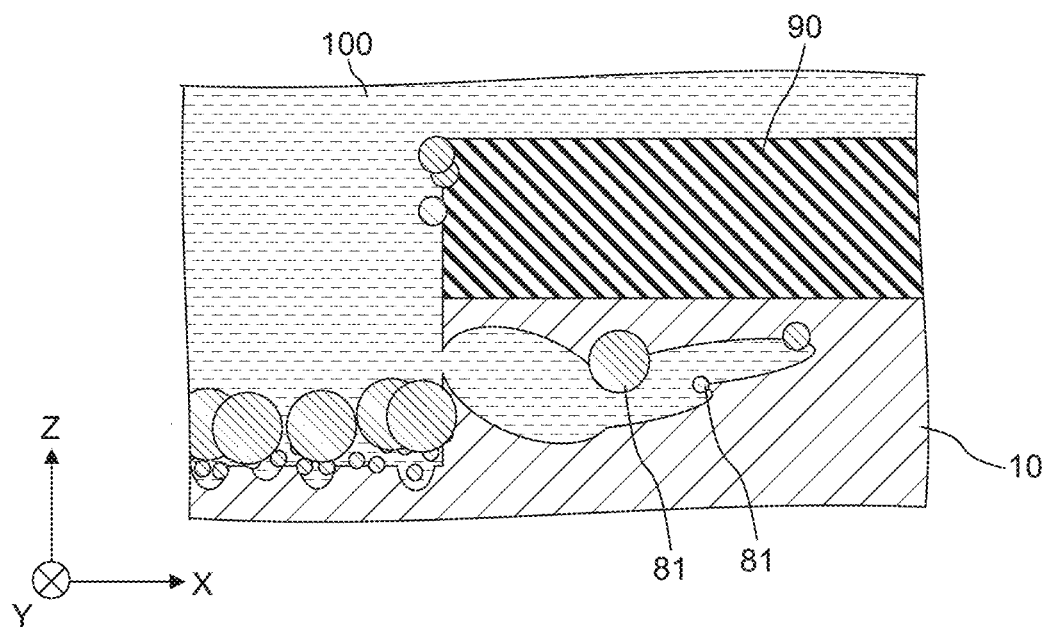
FIG. 9 is a cross-sectional view showing an example of an etching process when a groove is omitted.
Figure 10:
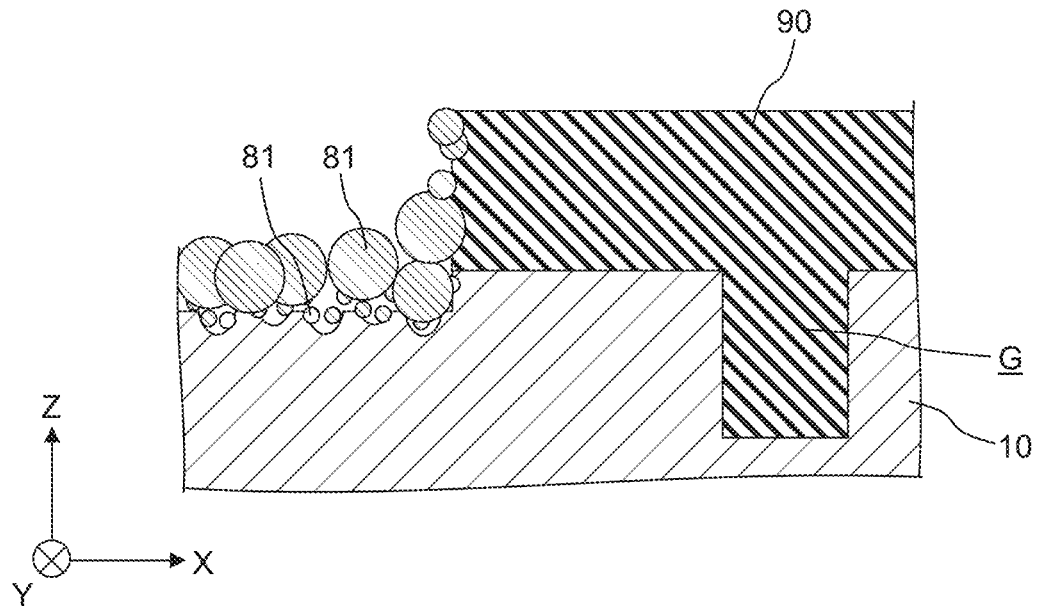
FIG. 10 is a cross-sectional view showing an example of a catalyst layer-forming process when a groove is provided.
Figure 11:
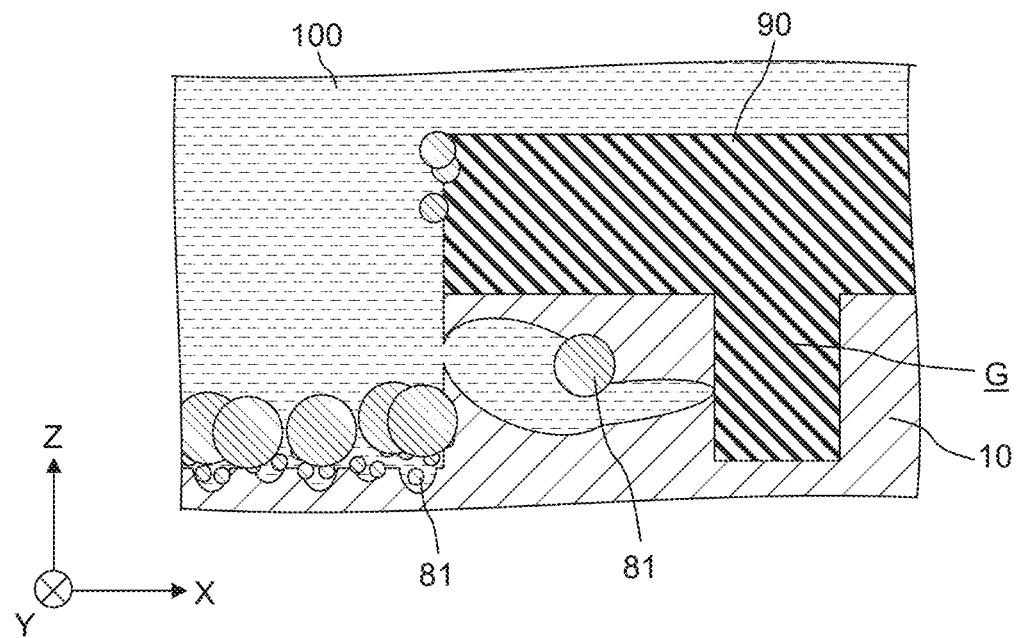
FIG. 11 is a cross-sectional view showing an example of an etching process when a groove is provided.

FIG. 8 is a cross-sectional view showing an example of a catalyst layer-forming process when a groove is omitted. FIG. 9 is a cross-sectional view showing an example of an etching process when a groove is omitted. FIG. 10 is a cross-sectional view showing an example of a catalyst layer-forming process when a groove is provided. FIG. 11 is a cross-sectional view showing an example of an etching process when a groove is provided. In this example, it is assumed that the catalyst layer 80 is formed by, for example, displacement plating.

In the case of forming the catalyst layer 80 by displacement plating, of the surface of the substrate 10, the region not covered with the mask layer 90 is lower than the region covered with the mask layer 90, as shown in FIG. 8. In other words, the surface of the substrate 10 includes a recess at a position of the opening of the mask layer 90.

In this state, when MacEtch is commenced, some of the catalyst particles 81 that are in the recess and near the mask layer 90 promote etching of the sidewall of the recess, as shown in FIG. 9. Thus, the etching progresses not only in the thickness direction of the substrate 10 but also in the in-plane direction. As a result, in the surface region of the substrate 10, holes extending from the sidewall of the recess are formed below the mask layer 90.

The deeper the recesses TR, the longer the holes. Therefore, if no groove G is provided, the holes may extend to a position below the region where the second internal electrode 70b should be formed.

In contrast, by providing the groove G as shown in FIG. 10, the etching in the in-plane direction is restricted within the region between the recess TR and the groove G, as shown in FIG. 11. Therefore, even if the recesses TR are formed to be deep, the possibility of the holes extending to a position below the region where the second internal electrode 70b should be formed can be significantly reduced.

Furthermore, if the groove G is provided, even when the etching is performed in the state in which the mask layer 90 has been removed, the possibility of the holes extending to a position below the region where the second internal electrode 70b should be formed can be significantly reduced. Generally, according to the etching described above, of the surface region of the substrate 10, not only the portion between the groove G and the recesses TR but also the portion between the adjacent recesses TR is porous.

A ratio D2/D1 of the shortest distance D2 from the recesses TR to the second region A2 with respect to the depth D1 of the recesses TR is preferably 1 or less, more preferably within a range from 0.01 to 1, and more preferably within a range from 0.05 to 0.1. If the ratio D2/D1 is excessively large, the hole may not reach the groove G and the advantage of providing the groove G is small. If the ratio D2/D1 is excessively small, the portion of the substrate 10 between the recess TR and the groove G may not be sufficiently strong.

A distance D3 from the first region A1 to the third region A3, namely, the width of the groove G, is preferably within a range of 10 to 500 nm, and more preferably within a range of 50 to 100 nm. The greater the distance D3, the smaller the electric capacitance per unit area.

A difference D4 in height between the first region A1 and the second region A2, namely, the depth of the groove G, is preferably within a range of 100 nm to 100,000 nm, and more preferably within a range of 1000 nm to 10,000 nm. If the difference D4 is smaller, the possibility of the holes extending to a position below the groove G will be higher. If the difference D4 is greater, a longer time will be required to form the groove G.

The difference D4 is preferably equal to or smaller than the depth D1. In this case, the influence of the difference D4 on the performance or the like of adjacent elements is small. The difference D4 is preferably half or smaller than the depth D1. In this case, the difference D4 has substantially no influence on the performance or the like of adjacent elements.

Various modifications can be made in this capacitor 1.

Figure 12:
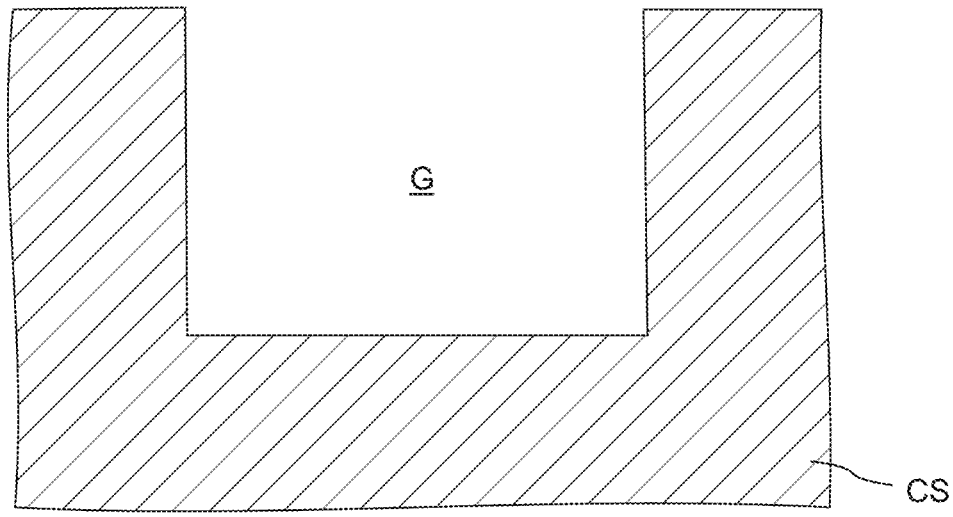
FIG. 12 is a cross-sectional view showing an example of a structure adoptable to a groove.
Figure 13:
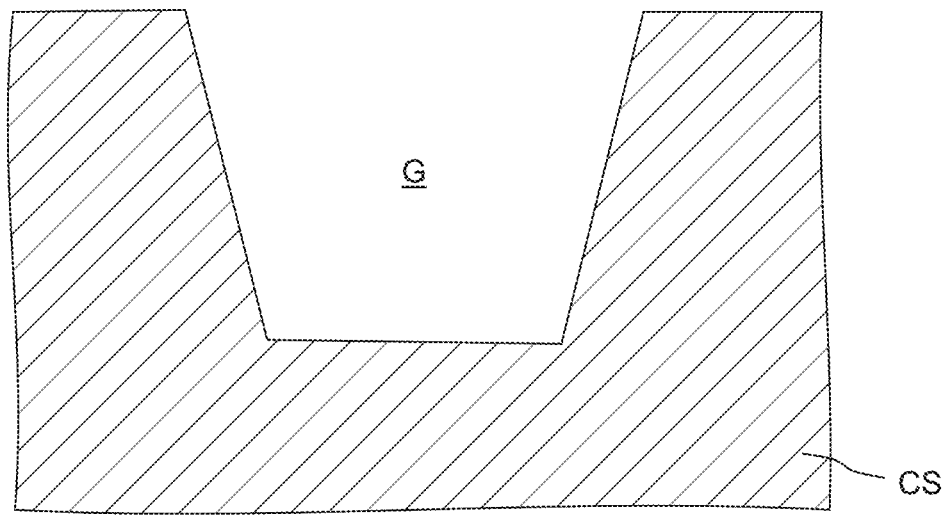
FIG. 13 is a cross-sectional view showing another example of a structure adoptable to a groove.
Figure 14:
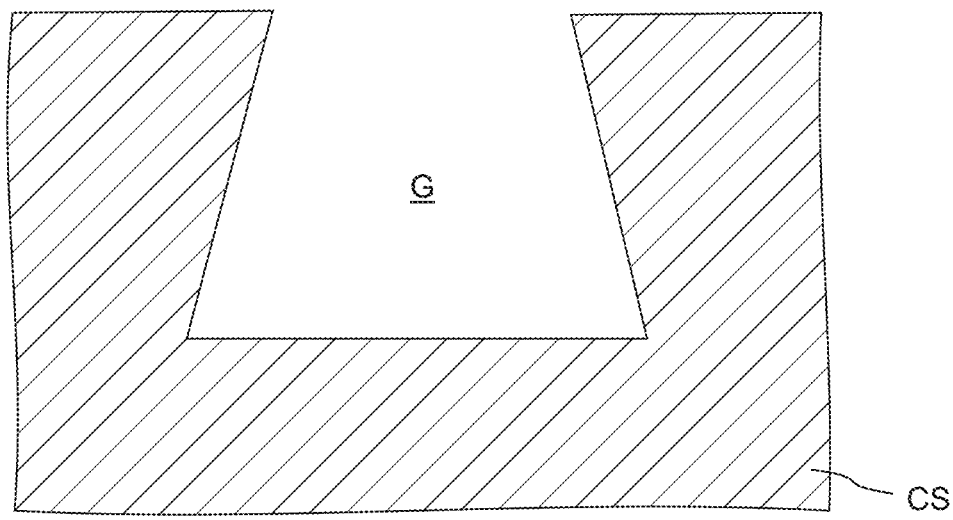
FIG. 14 is a cross-sectional view showing still another example of a structure adoptable to a groove.

FIG. 12 is a cross-sectional view showing an example of a structure adoptable to a groove. FIG. 13 is a cross-sectional view showing another example of a structure adoptable to a groove. FIG. 14 is a cross-sectional view showing still another example of a structure adoptable to a groove.

The cross section of the groove G perpendicular to the length direction may be a rectangle, as shown in FIG. 12. This structure is less prone to cause the holes to extend to a position below the groove G, even if the distance D3 is small. Furthermore, the structure is easy to form. Moreover, the structure is less prone to cause a discontinuous portion in the conductive layer 20a or the dielectric layer 30.

Alternatively, the cross section of the groove G perpendicular to the length direction may be a forward-tapered shape, as shown in FIG. 13. This structure is especially easy to form. Moreover, the structure is particularly less prone to form a discontinuous portion in the conductive layer 20a or the dielectric layer 30.

Alternatively, the cross section of the groove G perpendicular to the length direction may be a reverse-tapered shape, as shown in FIG. 14. This structure is particularly less prone to cause the holes to extend to a position below the groove G, even if the distance D3 is small.

Figure 15:
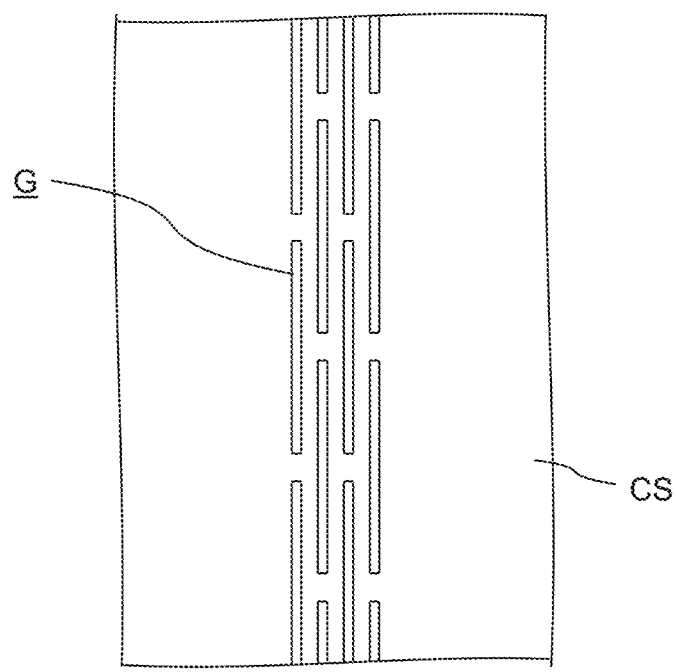
FIG. 15 is a plan view showing still another example of a structure adoptable to a groove.
Figure 16:
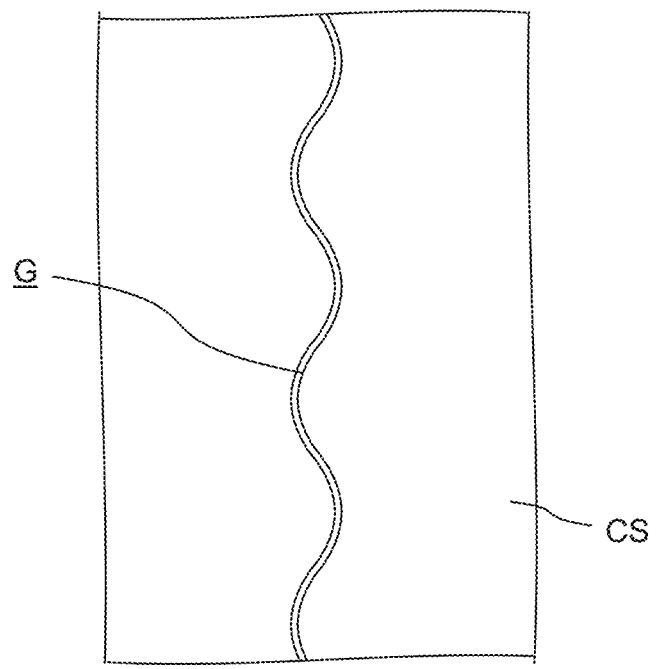
FIG. 16 is a plan view showing still another example of a structure adoptable to a groove.

FIG. 15 is a plan view showing still another example of a structure adoptable to a groove. FIG. 16 is a plan view showing still another example of a structure adoptable to a groove.

As shown in FIG. 15, a plurality of grooves G may be arranged in the width direction thereof between the first region A1 and the third region A3. In this case, one or more of the grooves G may be discontinuous, as shown in FIG. 15. Alternatively, the groove G may be curved, as shown in FIG. 16.

In the capacitor 1 described above, the second internal electrode 70b is a frame-shaped electrode arranged to surround the first internal electrode 70a. The second internal electrode 70b need not be frame-shaped. In other words, the third region A3 on which the second internal electrode 70b is provided need not be frame-shaped. In this case, the groove G also need not be frame-shaped.

The third region A3 shown in FIG. 2 and FIG. 3 may be equal in height to the second region A2, or may be lower than the second region A2. In other words, the first region A1, the second region A2, and the third region A3 may form one or two steps without forming a groove G.

Explanations have been given for the capacitor as an example of the structural body; however, the techniques described above can be applied to another structural body.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A structural body, comprising:
   a conductive substrate containing a semiconductor material; and
   an insulating layer, wherein
   the conductive substrate has a main surface including a first region and a second region, the second region being adjacent to the first region and lower in height than the first region,
   the first region is provided with one or more recesses having a bottom, a position of the bottom being lower than a position of the second region,
   the conductive substrate has a surface region on a side of the main surface, the surface region including a porous structure at a position between the second region and the one or more recesses, and
   the second region is entirely covered with the insulating layer.

2. The structural body according to claim 1, wherein
   the main surface is provided with one or more grooves thereon, and
   the second region is a bottom portion of the one or more grooves.

3. The structural body according claim 1, further comprising:
   a first electrode located above the first region; and
   a second electrode electrically insulated from the first electrode, wherein
   the main surface further includes a third region that is adjacent to the first region with the second region interposed therebetween, and
   the second electrode is located above the third region.

4. The structural body according claim 3, further comprising:
   a conductive layer covering a sidewall and a bottom surface of the one or more recesses and electrically connected to the first electrode; and
   a dielectric layer interposed between the conductive substrate and the conductive layer, and electrically insulating the conductive substrate and the conductive layer from each other,
   wherein the conductive substrate is electrically connected to the second electrode.

5. The structural body according claim 1, wherein a ratio D2/D1 of a shortest distance D2 from the one or more recesses to the second region with respect to a depth D1 of the one or more recesses is within a range from 0.01 to 1.

6. The structural body according claim 1, wherein a difference D4 in height between the first region and the second region is half or smaller than a depth D1 of the one or more recesses.

\* \* \* \* \*